United States Patent
Noshiro (10) Patent No.: US 8,106,377 B2
(45) Date of Patent: Jan. 31, 2012

(54) RESISTANCE CHANGE ELEMENT AND METHOD OF MANUFACTURING THE SAME

(75) Inventor: Hideyuki Noshiro, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 232 days.

(21) Appl. No.: 12/519,913

(22) Filed: Jun. 18, 2009

(65) Prior Publication Data
US 2010/0252796 A1    Oct. 7, 2010

Related U.S. Application Data

(63) Continuation of application No. PCT/JP2006/325297, filed on Dec. 19, 2006.

(51) Int. Cl.
H01L 29/94 (2006.01)
(52) U.S. Cl. .......... 257/4; 438/593
(58) Field of Classification Search .......... 257/2, 4, 257/536; 438/593
See application file for complete search history.

(56) References Cited

U.S. PATENT DOCUMENTS

| | | | |
|---|---|---|---|
| 6,849,891 B1* | 2/2005 | Hsu et al. | 257/296 |
| 7,525,832 B2 | 4/2009 | Muraoka et al. | |
| 7,577,022 B2 | 8/2009 | Muraoka et al. | |
| 2004/0245557 A1 | 12/2004 | Seo et al. | |
| 2005/0153504 A1 | 7/2005 | Kawazoe et al. | |
| 2005/0206892 A1 | 9/2005 | Wang et al. | |
| 2006/0098472 A1 | 5/2006 | Ahn et al. | |
| 2007/0048990 A1* | 3/2007 | Zhuang et al. | 438/593 |
| 2009/0067215 A1 | 3/2009 | Muraoka et al. | |
| 2010/0090192 A1* | 4/2010 | Goux et al. | 257/4 |

FOREIGN PATENT DOCUMENTS

| | | |
|---|---|---|
| EP | 1 555 700 A2 | 7/2005 |
| EP | 1 873 832 A1 | 1/2008 |
| JP | 2004-363604 A | 12/2004 |
| JP | 2005-203389 A | 7/2005 |
| JP | 2006-140489 A | 6/2006 |
| JP | 2006-324447 A | 11/2006 |
| WO | 2005/024839 A1 | 3/2005 |
| WO | 2006/115208 A1 | 11/2006 |

OTHER PUBLICATIONS

Supplementary European Search Report dated Dec. 22, 2010, issued in corresponding European Patent Application No. 06842901.8.
Gibbons J. F. et al.; "Switching Properties of Thin NiO Films"; Solid-State Electronics UK, vol. 7, No. 11, Nov. 1964, pp. 785-797, XP002612768.

(Continued)

*Primary Examiner* — Thomas L Dickey
(74) *Attorney, Agent, or Firm* — Westerman, Hattori, Daniels & Adrian, LLP (57) ABSTRACT

In a resistance change element (ReRAM) storing data by utilizing change in resistance of a resistance change element, the resistance change element is configured of a lower electrode made of a noble metal such as Pt, a transition metal film made of a transition metal such as Ni, a transition metal oxide film made of a transition metal oxide such as NiOx, and a lower electrode made of a noble metal such as Pt.

3 Claims, 8 Drawing Sheets

OTHER PUBLICATIONS

Seo S. et al.; "Conductivity switching characteristics and reset currents in NiO Films"; Applied Physics Letter, AIP, American Institute of Physics, Melville, NY, US, vol. 86, No. 9, Feb. 25, 2005, pp. 93509-093509, XP012066564.

International Search Report of PCT/JP2006/325297, Mailing Date of Mar. 6, 2007.

Kinoshita K. et al. "Bias Polarity Dependent Data Retention Of Resistive Random Access Memory Consisting of Binary Transition metal Oxide." Applied Physics Letters. 2006, vol. 89, pp. 103509-1-103509-3.

Seo S. et al. "Reproducible Resistance Switching In polycrystalline NiO Films." Applied Physics Letters, Dec. 6, 2004, vol. 85, No. 23, pp. 5655-5657.

* cited by examiner

PRACTICAL EXAMPLE

FIG. 5

COMPARATIVE EXAMPLE

RESISTANCE CHANGE ELEMENT AND METHOD OF MANUFACTURING THE SAME

CROSS-REFERENCE TO RELATED APPLICATIONS

This application is a continuation of prior International Patent Application No. PCT/JP2006/325297, filed Dec. 19, 2006, the entire contents of which are incorporated herein by reference.

FIELD

The embodiment discussed herein relates to a resistance change element storing data by utilizing change in a resistance value and a method of manufacturing the same.

BACKGROUND

In recent years, further size reduction, lower power consumption and higher functionality have been demanded for information apparatuses such as computers. Along with these demands, there has also been a demand for non-volatile semiconductor memories that enable higher integration, operate at a higher speed, and retain stored data even when power is not supplied. As one of the next generation non-volatile semiconductor memories capable of meeting such demands, a resistance change memory (Resistive Random Access Memory: hereinafter referred to as "ReRAM") including a resistance change element has been developed (see, for example, Non Patent Citations 1, 2).

Figure 1:
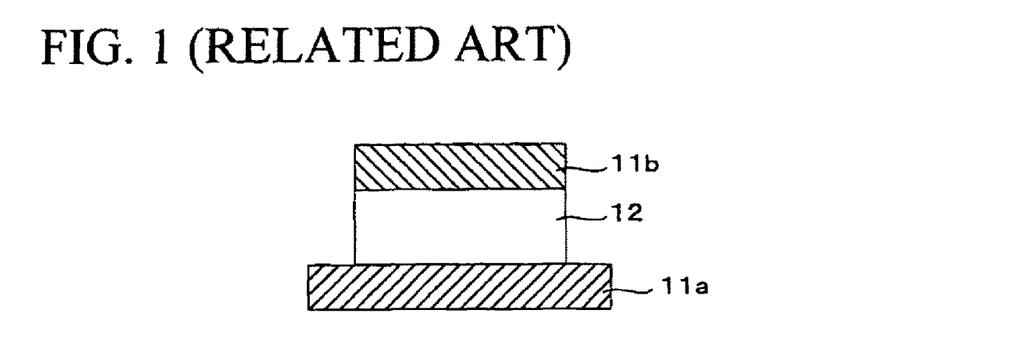
FIG. 1 is a cross-sectional view depicting a related resistance change element.

In a ReRAM, data is stored by utilizing change in a resistance value of a resistance change element. As depicted in FIG. 1, the resistance change element is configured such that an NiO film (nickel oxide film) 12 or another transition metal oxide film is sandwiched in between a pair of electrodes 11a, 11b made of Pt (platinum). When a treatment applying a predetermined voltage to the resistance change element configured as such (an electroforming: hereinafter referred to as "forming") is carried out, it is possible to change the resistance value by controlling the current and voltage.

Figure 2:
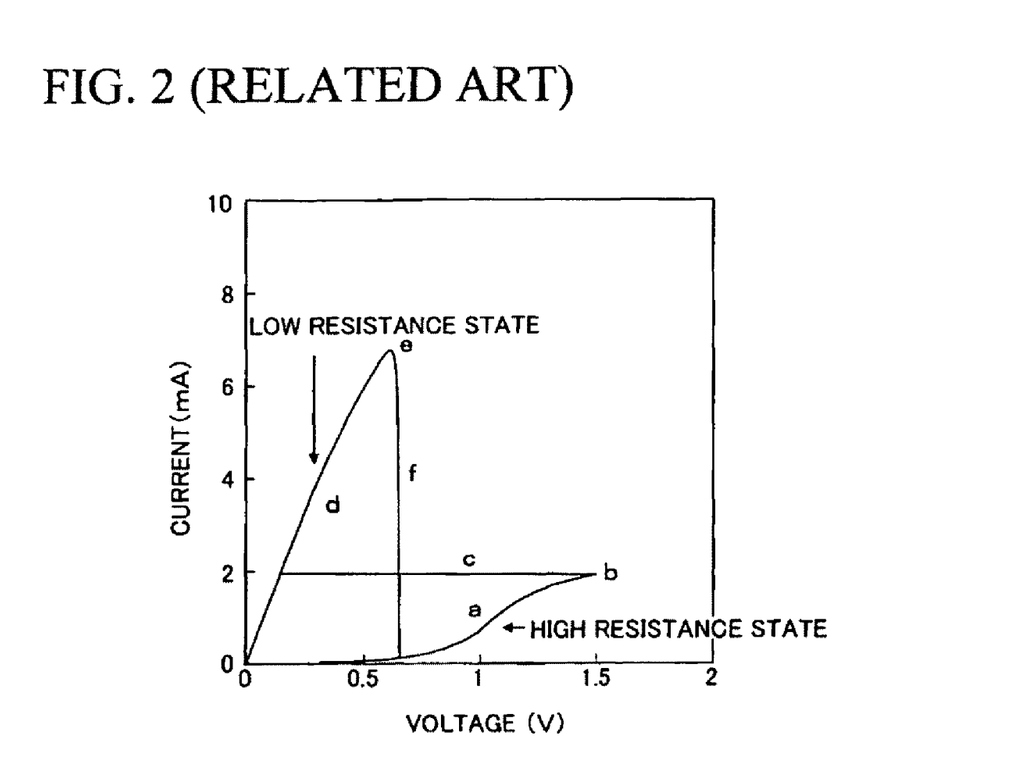
FIG. 2 is a view depicting an example of the state change of a resistance change element.

FIG. 2 is a view depicting the state change of the resistance change element by taking the horizontal axis as voltage and the vertical axis as current. As depicted in FIG. 2, the resistance change element transitions between a high resistance state and a low resistance state according to the current flowing through the inside of the resistance change element and the voltage applied thereto. In the high resistance state, as depicted by a in the Figure, the current flowing through the inside of the resistance change element increases as the applied voltage becomes higher, while the inclination of the curved line depicting the relationship between the voltage and the current is relatively small. In contrast, when the applied voltage becomes equal to or higher than a specified voltage (as depicted by b in FIG. 2), the resistance value decreases rapidly (as depicted by c in the Figure). As a result, the current increases rapidly. For this reason, a limiter circuit for preventing rapid current increase is provided for the ReRAM so as to prevent a large current from flowing into the resistance change element.

In the low resistance state, as depicted by d in the Figure, the inclination of the curved line depicting the relationship between the voltage and the current is large. When the current flowing into the resistance change element becomes a specified value (as depicted by e in the Figure), the resistance change element transitions to the high resistance state (as depicted by f in the Figure), and the current decreases rapidly.

As described above, the resistance change element transitions to the low resistance state when a voltage equal to or higher than a specified voltage is applied in the high resistance state, while the resistance change element transitions to the high resistance state when a current equal to or higher than a specified current is applied in the low resistance state. The resistance value in the low resistance state is approximately several k$\Omega$ and the resistance value in the high resistance state is from approximately several tens k$\Omega$ to 1 M$\Omega$. Note that, in general, the change from the high resistance state to the low resistance state is referred to as "set" and the change from the low resistance state to the high resistance state is referred to as "reset".

Since the NiO film constituting the resistance change element is an oxide film, the electrodes holding both sides of the NiO film is in an easily-oxidizable state. For this reason, the electrodes of the resistance change element are formed of a metal which is hardly oxidized. Specifically, the electrodes are formed of a noble metal such as Pt or Ir (iridium). Patent Citation 1 describes a non-volatile memory having a resistance change element with the structure in which a film made of any of transition metal oxides such as NiO, $TiO_2$, HfO, ZrO, ZnO, $WO_3$, CoO, and $Nb_2O_5$ is sandwiched in between a pair of electrodes.

Patent Citation 1: Japanese Laid-open Patent Application Publication No. 2006-140489

Non Patent Citation 1: K. Kinoshita et al., "Bias polarity dependent data retention of resistive random access memory consisting of binary transition metal oxide", APPLIED PHYSICS LETTER 89, 103509 (2006)

Non Patent Citation 2: S. Seo et al., "Reproducible resistance switching in polycrystalline NiO films", APPLIED PHYSICS LETTER Vol. 85, No. 23, 6 Dec. 2004)

SUMMARY

According to an aspect of the embodiment, a resistance change element storing data by utilizing change in resistance value is configured of a ground-side electrode and a positive polarity-side electrode, each being made of any one of a noble metal and a noble metal oxide, a transition metal film formed in contact with the ground-side electrode, and a transition metal oxide film formed between the transition metal film and the positive polarity-side electrode.

According to another aspect of the embodiment, a method of manufacturing a resistance change element includes forming a first noble metal film made of any one of a noble metal and a noble metal oxide above a semiconductor substrate, forming a transition metal film on the first noble metal film, forming a transition metal oxide film on the transition metal film by a sputtering method, and forming a second noble metal film made of any one of a noble metal and a noble metal oxide on the transition metal oxide film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENT

The inventor of the present application and the like have found the following problem in a related ReRAM. Specifically, as depicted in FIG. 2, a related resistance change element needs to receive a current of several mA to 10 mA or more in order to transition from the low resistance state to the high resistance state. On the other hand, unless a current flowing through each cell is set to be equal to or less than 1 mA, the power consumption of a semiconductor storage device (IC) is so huge, but depending on its required memory capacity, that the commercialization thereof is difficult.

The inventor of the present application and the like have carried out various studies with an intention to reduce the driving current of ReRAM. As a result, it has been found that the driving current of ReRAM can be reduced when an Ni (nickel) film is formed between the ground-side (negative polarity-side) electrode and transition metal oxide film (NiO film) of the resistance change element. It is not apparent why the driving current decreases when the Ni film is formed between the ground-side electrode and transition metal oxide film of the resistance change element. However, the reason is presumably that if there is no Ni film, the diffusion of elements from the noble metal electrode to the transition metal oxide film or the diffusion of oxygen from the transition metal oxide film to the noble metal electrode is generated to cause driving voltage to be higher and driving current to be larger, whereas if the Ni film is formed between the ground-side electrode and the transition metal oxide film, such a phenomenon is not generated.

Hereinafter, a preferred embodiment will be described by referring to the accompanying drawings.

Figure 3:
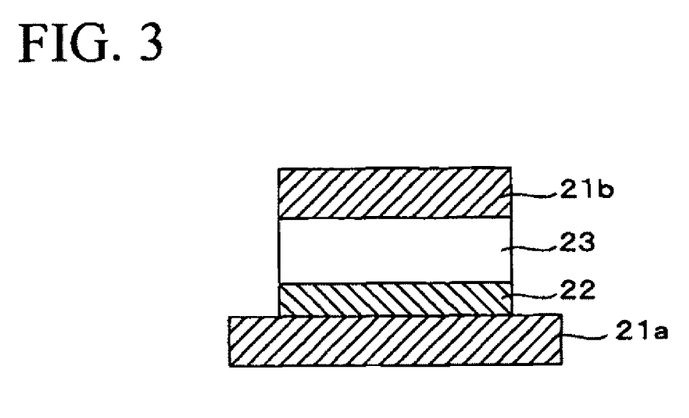
FIG. 3 is a cross-sectional view depicting a resistance change element according to an embodiment.

FIG. 3 is a cross-sectional view depicting a resistance change element of a ReRAM according to an embodiment. As depicted in FIG. 3, the resistance change element of the ReRAM according to the present embodiment is configured by laminating, in the following order from the bottom up, a lower electrode (ground-side electrode) 21a made of Pt (platinum), a transition metal film 22 made of Ni (nickel), a transition metal oxide film 23 made of NiOx (nickel oxide film), and an upper electrode (positive polarity-side electrode) 21b made of Pt. Here, x in NiOx is any positive number, and preferably larger than 0 and less than 2 in order to obtain a preferable characteristic.

The lower electrode 21a and the upper electrode 21b may be formed of a noble metal other than Pt, for example, Pd (palladium), Ru (ruthenium), or Ir (iridium), or an oxide thereof. In addition, the transition metal film 22 may be formed of a transition metal other than Ni, for example, Ti (titanium), Co (cobalt), or Ta (tantalum). However, in this case, it is preferable that the transition metal oxide film 23 be formed of an oxide film of the transition metal constituting the transition metal film 22, for example, a $TiO_2$ film, a CoO film, or a $Ta_2O_5$ film.

Figure 4:
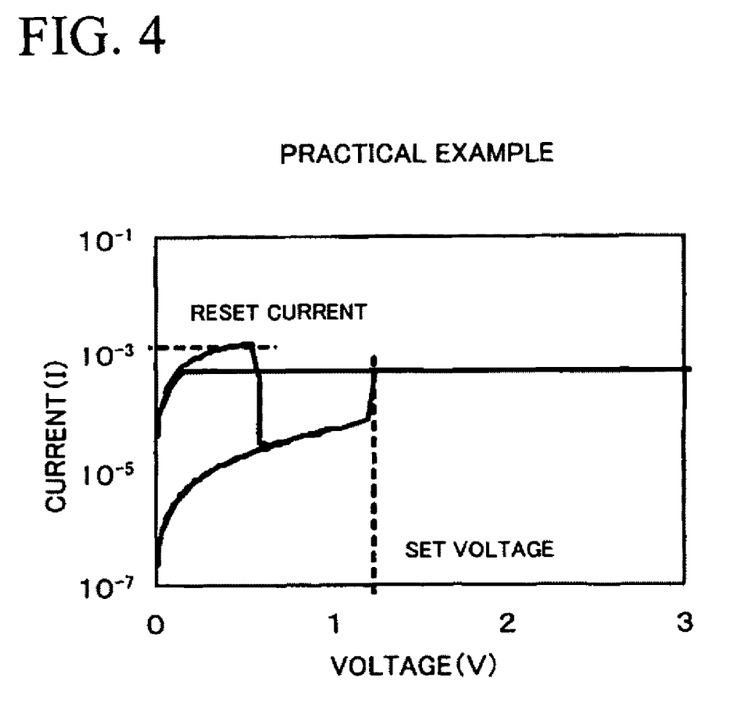
FIG. 4 is a view depicting the characteristic of a resistance change element according to a practical example.
Figure 5:
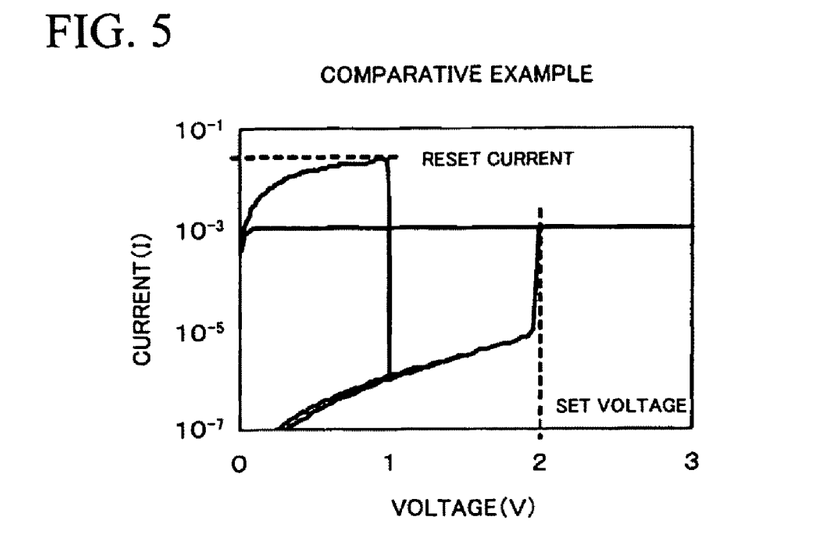
FIG. 5 is a view depicting the characteristic of a resistance change element according to a comparative example.

FIG. 4 is a view depicting the characteristic of the resistance change element according to the present embodiment depicted in FIG. 3 (hereinafter referred to a practical example) by taking the horizontal axis as voltage and the vertical axis as current. FIG. 5 is a view depicting the characteristic of a resistance change element having the configuration depicted in FIG. 1 (hereinafter referred to as a comparative example).

As can be seen from FIG. 4, in the resistance change element according to the practical example where a transition metal film (Ni film) is formed between a lower electrode (Pt electrode) and a transition metal oxide film (NiOx film), the set voltage is approximately 1.2 V, which is low, and the reset current is approximately 1 mA, which is also low. In contrast, as can be seen from FIG. 5, in the resistance change element according to the comparative example where a transition metal film is not formed between a lower electrode (Pt electrode) and a transition metal oxide film (NiOx film), the set voltage is approximately 2 V and the reset current is approximately 20 mA, which are large.

Figure 6A:
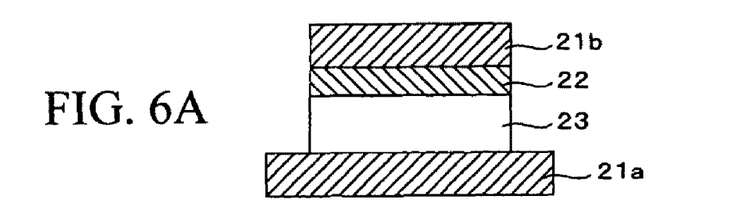
FIGS. 6A and 6B are cross-sectional views depicting the configuration examples in each of which a resistance change element is not formed.
Figure 6B:
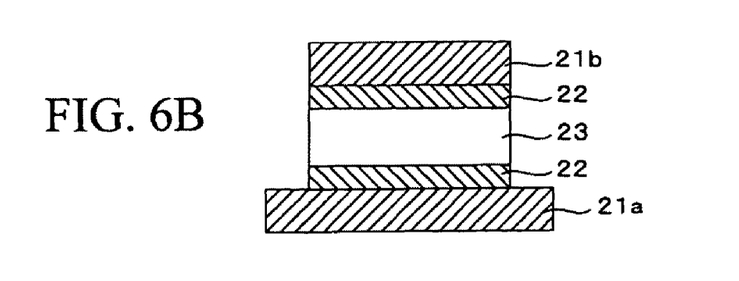

Note that, as depicted in FIG. 6A, it is conceivable that the transition metal film 22 is formed between the transition metal film 23 and the upper electrode 21b. In addition, as depicted in FIG. 6B, it is conceivable that the transition metal film 22 is formed between the lower electrode 21a and the transition metal oxide film 23 as well as between the transition metal oxide film 23 and the upper electrode 21b. However, in the experiment carried out by the inventors of the present application, it has been found that the resistance change characteristic is not indicated with the configurations depicted in FIGS. 6A and 6B.

Figure 7:
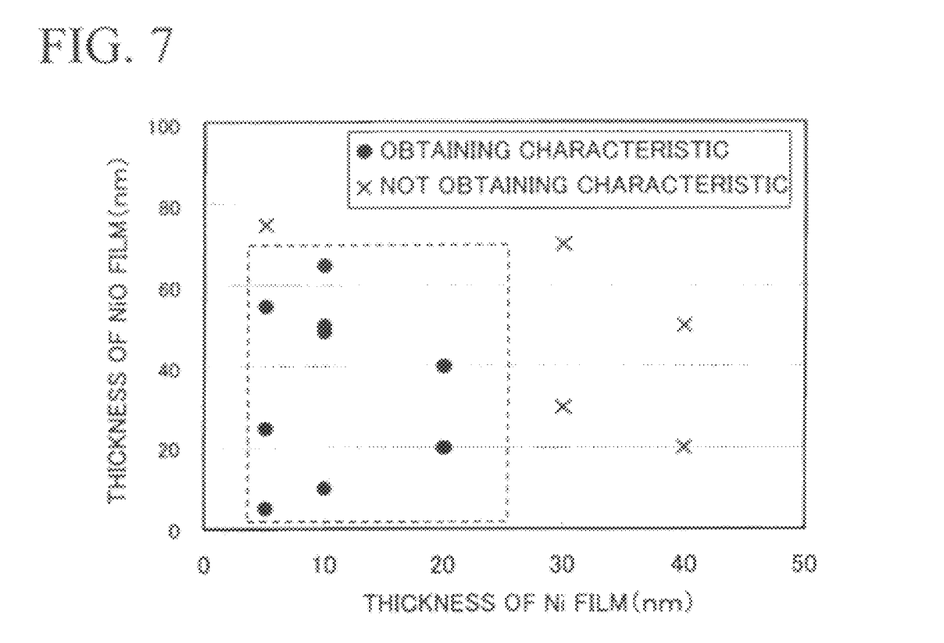
FIG. 7 is a view depicting the results of checking the relationship between the thickness and characteristic of a transition metal film (Ni film) and transition metal oxide film (NiOx film)

Next, in the configuration depicted in FIG. 3, the inventors of the present application formed a large number of resistance change elements, each having different thicknesses of the transition metal film (Ni film) 22 and the transition metal oxide film (NiOx film) 23, and checked characteristics thereof. FIG. 7 depicts these results. As depicted in this FIG. 7, the preferable resistance change characteristic is indicated only when the thickness of the transition metal film (Ni film) is between 5 nm and 20 nm inclusive while the thickness of the transition metal oxide film (NiOx film) is between 5 nm and 65 nm inclusive (the range surrounded by the broken line in the Figure), and the preferable resistance change is not indicated in a range other than that. In other words, the resistance value becomes excessively low if the thickness of the transition metal oxide film is less than 5 nm. As a result, the resistance value required in a high resistance state cannot be obtained. In addition, if the thickness of the transition metal oxide film exceeds 65 nm, the resistance value becomes excessively high. As a result, the resistance value required in a low resistance state cannot be obtained. Furthermore, if the thickness of the transition metal film is less than 5 nm, the effect of reducing the reset current cannot be sufficiently obtained.

Figure 8A:
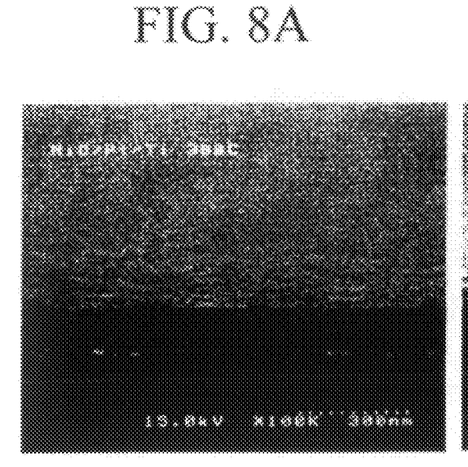
FIG. 8A is a photomicrograph indicating the surface state of a layered product of an NiOx film, a Pt film, and a Ti film.
Figure 8B:
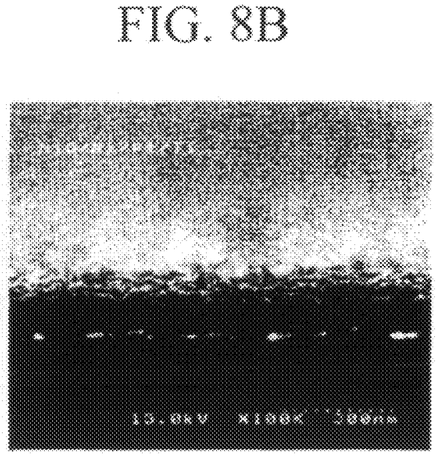
FIG. 8B is a photomicrograph indicating the surface state of a layered product of an NiOx film, an Ni film, a Pt film, and a Ti film.

It is not apparent why the characteristic cannot be sufficiently obtained when the thickness of the transition metal film (Ni film) exceeds 20 nm. However, it is presumable that the reaction between Pt and Ni develops to lead to an increase in unevenness on the surface of the NiOx film. FIG. 8A is a photomicrograph indicating the surface state of a layered product of an NiOx film, a Pt film, and a Ti film. FIG. 8B is a photomicrograph indicating the surface state of a layered product of an NiOx film, an Ni film, a Pt film, and a Ti film. By referring to these FIGS. 8A and 8B, it can be seen that if the Ni film is thickly formed between the NiOx film and the Pt film, the unevenness on the surface of the NiOx film becomes larger. This presumably causes the resistance between the NiOx film and the Pt film to be unstable.

(ReRAM)

Figure 9:
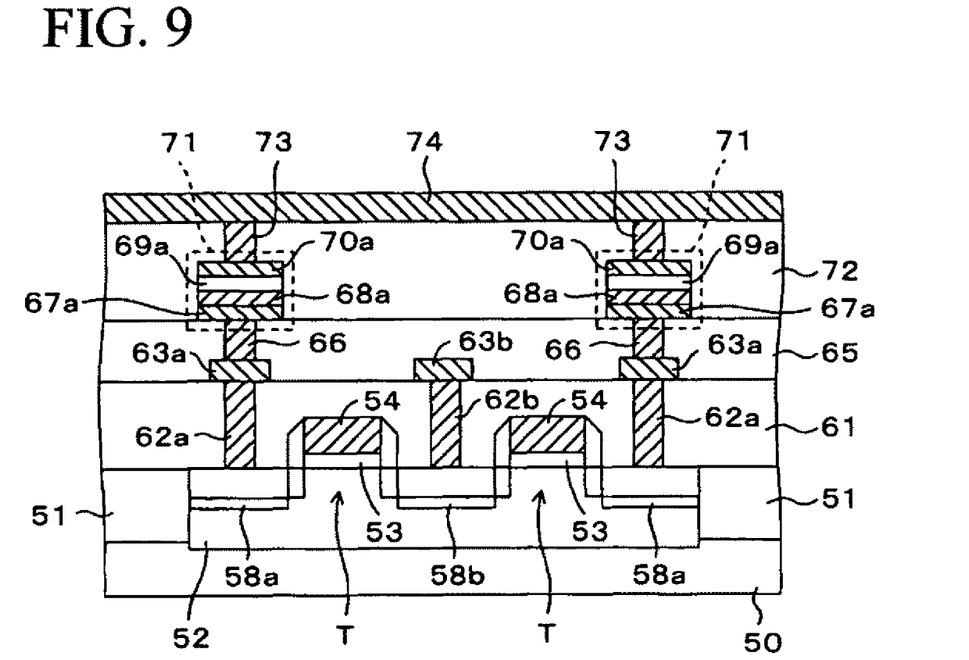
FIG. 9 is a cross-sectional view depicting one example of a ReRAM according to an embodiment.

FIG. 9 is a cross-sectional view depicting one example of a ReRAM using the above-described resistance change element. Here, there is depicted an example in which the present embodiment is applied to a stack-type ReRAM. In addition, it is assumed that a memory cell is configured of an n-type transistor.

A semiconductor substrate 50 is separated into multiple element regions by an element isolation film 51. As depicted in FIG. 9, in the memory cell region, a p-well 52 formed by introducing a p-type impurity into the semiconductor substrate 50 is provided and two gate electrodes 54 are formed on this p-well 52 through a gate insulating film 53. These gate electrodes 54 are disposed so as to be parallel to each other. In addition, on both sides of the gate electrodes 54, high concentration impurity regions 58a, 58b formed by introducing an impurity with high concentration into the surface of the p-well 52 are disposed to configure a transistor T together with each gate electrode 54. It should be noted that the high concentration impurity region 58a is an impurity region (drain) disposed between the gate electrode 54 and the element isolation film 51. The high concentration impurity region 58b is an impurity region (source) disposed between the two gate electrodes 54. As depicted in this FIG. 9, in the present embodiment, the high concentration impurity region 58b is set to be an impurity region which is common in the two transistors (selection transistors) T.

These transistors T are covered with a first interlayer insulating film 61 formed above the semiconductor substrate 50. W plugs 62a, 62b are provided in this first interlayer insulating film 61. The W plugs 62a, 62b are formed by filling W (tungsten) into contact holes reaching the high concentration impurity regions 58a, 58b from the upper surface of the first interlayer insulating film 61. The W plug 62a is connected to the high concentration impurity region 58a and the W plug 62b is connected to the high concentration impurity region 58b.

A pad 63a and a wiring 63b are formed on the first interlayer insulating film 61. The pad 63a is disposed on the W plug 62a and is electrically connected to the W plug 62a. In addition, the wiring 63b passes on the W plug 62b and is electrically connected to the high concentration impurity region 58b through the W plug 62b.

A second interlayer insulating film 65 is formed on the first interlayer insulating film 61. The pad 63a and the wiring 63b are covered with this second interlayer insulating film 65. W plugs 66 are provided in this second interlayer insulating film 65. The W plugs 66 are formed by filling W into contact holes, each reaching the pad 63a from the upper surface of the second interlayer insulating film 65.

A resistance change element 71 is formed on the second interlayer insulating film 65 by laminating a lower electrode 67a made of Pt, a transition metal film 68a made of Ni, a transition metal oxide film 69a made of NiOx, and an upper electrode 70a made of Pt. This resistance change element 71 is disposed on each W plug 66, while the lower electrode 67a is electrically connected to the high concentration impurity region 58a through the W plug 66, the pad 63a, and the W plug 62a. Note that, in the present embodiment, the lower electrode 67a is directly formed on the interlayer insulating film 65 (and the W plug 66). However, a Ti (titanium) film or a TiN (titanium nitride) film may be formed between the interlayer insulating film 65 (and the W plug 66) and the lower electrode 67a. With this configuration, adhesiveness between the interlayer insulating film 65 and the lower electrode 67a is improved and electrical connectivity between the W plug 66 and the lower electrode 67a is also improved.

A third interlayer insulating film 72 is formed on the second interlayer insulating film 65. The resistance change element 71 is covered with this third interlayer insulating film 72. W plugs 73 are provided in the third interlayer insulating film 72. The W plugs 73 are formed by filling W into contact holes, each reaching the upper electrode 70a of the resistance change element 71 from the upper surface of the third interlayer insulating film 72.

A wiring 74 is formed on the third interlayer insulating film 72. This wiring 74 is electrically connected to the upper electrode 70a of the resistance change element 71 through the W plug 73.

In the ReRAM configured as such, the wiring 74, the gate electrode 54 of each transistor T, and the wiring 63b respectively become a bit line, a word line, and a ground line. When the resistance change element 71 is set, the transistor T is turned on to apply a predetermined voltage to the resistance change element 71 through the wiring 74 (bit line) by setting the lower electrode 67a to a ground potential. Additionally, when the resistance change element 71 is reset, the transistor T is turned on to apply a predetermined current to the resistance change element 71 through the wiring (bit line) 74 by setting the lower electrode 67a to a ground potential. Furthermore, when the state of the resistance change element 71 is detected, the transistor T is turned on to check resistance between the wiring (bit line) 74 and the wiring 63b (ground line).

In the ReRAM according to the present embodiment, the resistance change element 71 is configured of the lower electrode 67a made of Pt, the transition metal film 68a made of Ni, the transition metal oxide film 69a made of NiOx, and the upper electrode 70a made of Pt. Therefore, there is such an effect that a driving voltage is low and a driving current is small. With this effect, the ReRAM can be highly integrated to meet such demands that information apparatuses are further reduced in size and save power consumption while having higher functionality.

(Manufacturing Method of ReRAM)

FIGS. 10A to 10H are cross-sectional views, each depicting a method of manufacturing the above-described ReRAM in the order of processes. In general, a memory cell as well as an n-type transistor and a p-type transistor which constitute driving circuits (a write circuit and a read circuit) are formed on a semiconductor substrate, but are not depicted in the figures herein.

Figure 10A:
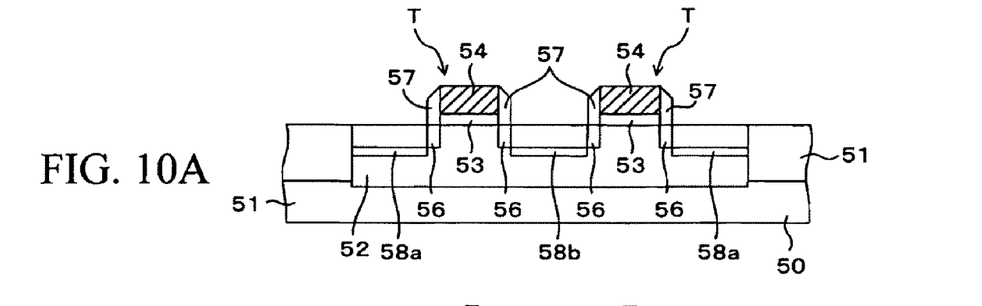
FIGS. 10A-10H are cross-sectional views depicting a method of manufacturing a ReRAM according to the embodiment.

Firstly, the process to form the structure depicted in FIG. 10A will be described. As depicted in FIG. 10A, the element isolation film 51 is formed in a predetermined region in the semiconductor substrate (silicon substrate) 50 by the well-known STI (Shallow Trench Isolation) method or the LOCOS (Local Oxidation of Silicon) method. The surface of the semiconductor substrate 50 is separated into multiple element regions by the resultant element isolation film 51.

Next, a p-type impurity such as boron (B) is introduced into an n-type transistor forming region (a memory cell region and an n-type transistor forming region of the driving circuit; hereinafter, the same) in the semiconductor substrate 50 to form the p-well 52. In addition, an n-type impurity such as phosphorus (P) is introduced into a p-type transistor forming region (a p-type transistor forming region of the driving circuit; hereinafter, the same) in the semiconductor substrate 50 to form an n-well (unillustrated).

Subsequently, the surfaces of the p-well 52 and the n-well (unillustrated) are thermally oxidized to form the gate insulating film 53. After that, a polysilicon film is formed on the entire upper surface of the semiconductor substrate 50 by the CVD (Chemical Vapor Deposition) method. The resultant polysilicon film is patterned by the photolithography method and the etching method to form the gate electrodes 54. At this time, as depicted in FIG. 10A, in the memory cell region, the two gate electrodes 54 serving as word lines are disposed on one p-well 52 so as to be parallel to each other.

Thereafter, using the gate electrodes 54 as masks, an n-type impurity such as phosphorus (P) with low concentration is ion-implanted into the p-well 52 in the n-type transistor forming region, so that n-type low concentration impurity regions 56 are formed. Similarly, using the gate electrodes 54 as masks, a p-type impurity such as boron (B) with low concentration is ion-implanted into the n-well (unillustrated) in the p-type transistor forming region, so that p-type low concentration impurity regions (unillustrated) are formed.

Thereafter, side walls 57 are formed on both sides of the gate electrode 54. These side walls 57 are formed such that an insulating film made of $SiO_2$, SiN, or the like is formed on the entire upper surface of the semiconductor substrate 50 by the CVD method, and then the resultant insulating film is etched back to be left only on the both sides of the gate electrode 54.

Thereafter, using the gate electrode 54 and the side walls 57 as masks, an n-type impurity with high concentration is ion-implanted into the p-well 52 in the n-type transistor forming region, so that the n-type high concentration impurity regions 58a, 58b are formed. Similar to this, using the gate electrode in the p-type transistor forming region and the side walls as masks, a p-type impurity with high concentration is ion-implanted into the n-well (unillustrated), so that p-type high concentration impurity regions (unillustrated) are formed. In this manner, the transistor T having a source and a drain with an LDD (Lightly Doped Drain) structure is formed in each transistor forming region.

Figure 10B:
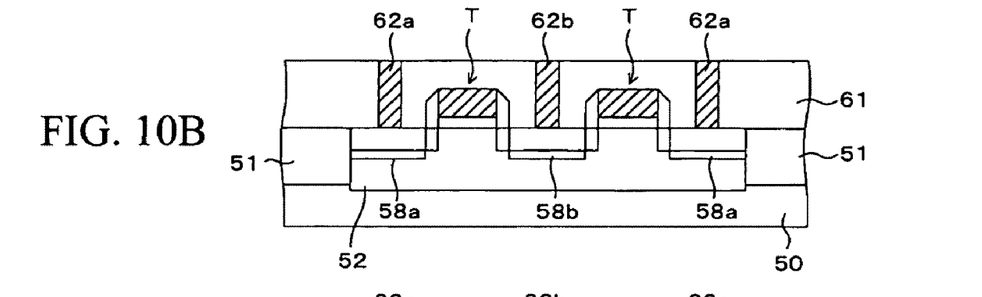

Next, the process to form the structure depicted in FIG. 10B will be described. After the transistor T is formed by the process described above, an $SiO_2$ film, for example, is formed as the first interlayer insulating film 61 on the entire upper surface of the semiconductor substrate 50 by the CVD method. The transistor T is covered with the resultant interlayer insulating film 61. After that, the surface of the first interlayer insulating film 61 is polished and planarized by the CMP (Chemical Mechanical Polishing) method.

Subsequently, by using the photolithography method and the etching method, contact holes reaching the n-type high concentration impurity regions 58a, 58b in the n-type transistor forming region from the upper surface of the first interlayer insulating film 61 are formed. After that, a TiN film (unillustrated) serving as a barrier metal is formed on the entire upper surface of the semiconductor substrate 50 by the sputtering method. Thereafter, a W film is formed on the TiN film by the sputtering method or the CVD method, while W is filled in the contact holes. After that, the W film and the TiN film are polished by the CMP method until the first interlayer insulating film 61 is exposed. In this manner, the W plugs 62a, 62b made by being filled with W are formed in the contact holes. Here, the W plug 62a is a plug connected to the high concentration impurity region 58a and the W plug 62b is a plug connected to the high concentration impurity region 58b.

Figure 10C:
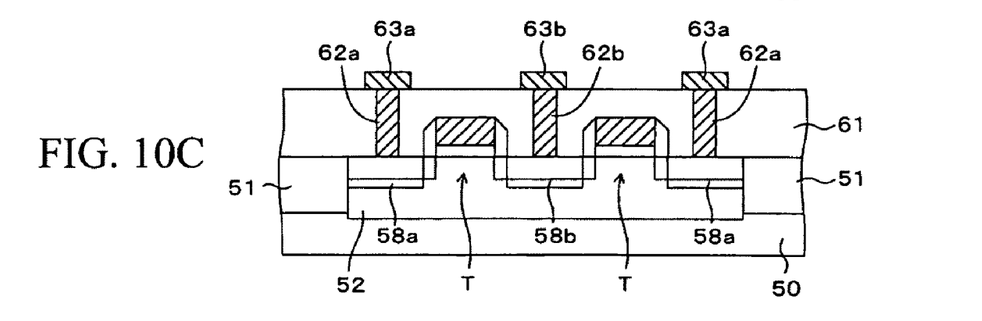

Next, the process to form the structure depicted in FIG. 10C will be described. After the W plugs 62a, 62b are formed by the process described above, a conducting film formed of a metal such as aluminum or copper is formed on the first interlayer insulating film 61 and the W plugs 62a, 62b by the sputtering method. Subsequently, the resultant conducting film is patterned by the photolithography method and the etching method to form the pad 63a and the wiring 63b. The pad 63a is formed on the W plug 62a and is electrically connected to the W plug 62a. In addition, the wiring 63b passes on the plug 62b and is electrically connected to the W plug 62b.

Figure 10D:
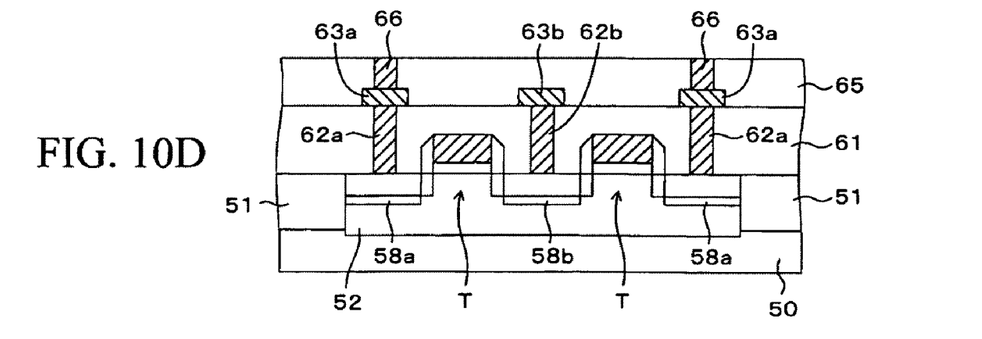

Next, the process to form the structure depicted in FIG. 10D will be described. After the pad 63a and the wiring 63b are formed by the process described above, the second interlayer insulating film 65 made of $SiO_2$ is formed on the entire upper surface of the semiconductor substrate 50 by the CVD method. Subsequently, the surface of the resultant interlayer insulating film 65 is polished and planarized by the CMP method. Thereafter, by using the photolithography method and the etching method, contact holes, each reaching the pad 63a from the upper surface of the second interlayer insulating film 65, are formed. After that, a TiN film (unillustrated) serving as a barrier metal is formed on the entire upper surface of the semiconductor substrate 50 by the sputtering method. Thereafter, a W film is formed on the TiN film by the sputtering method or the CVD method, while W is filled in the contact holes. After that, the W film and the TiN film are polished by the CMP method until the second interlayer insulating film 65 is exposed. In this manner, the W plug 66 made by being filled with W is formed in the contact holes.

Next, the process to form the structure depicted in FIGS. 10E and 10F will be described. After the W plug 66 is formed by the process described above, a Ti or TiN film (unillustrated) is formed, with the thickness of, for example, 20 nm, on the second interlayer insulating film 65 and the W plug 66 by the sputtering method. This Ti or TiN film is not a must, but, as described above, serves to improve the adhesiveness between the interlayer insulating film 65 and the lower electrode 67a as well as the electrical connectivity between the W plug 66 and the lower electrode 67a.

Figure 10E:
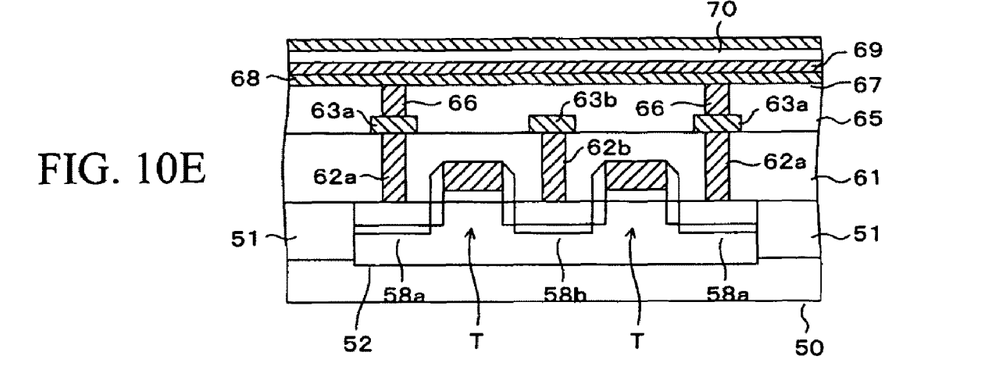
Figure 10F:
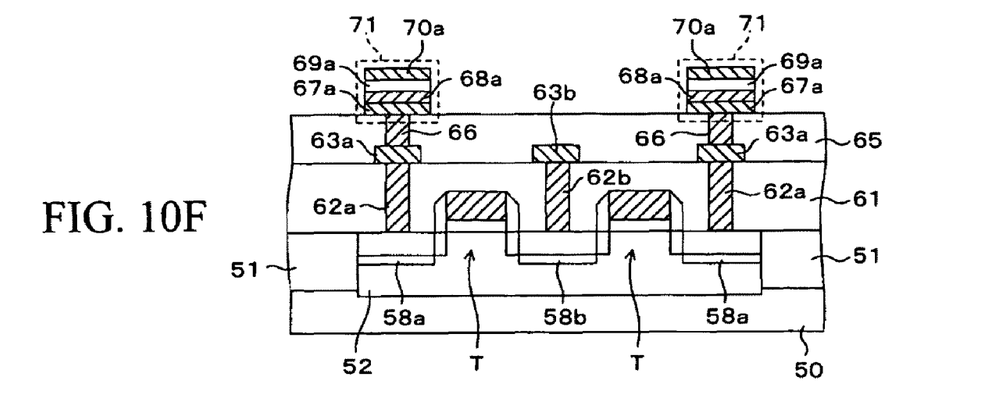

Subsequently, as depicted in FIG. 10E, by the sputtering method, the Pt film 67 serving as a lower electrode, the Ni film 68 serving as a transition metal film, the NiOx film 69 serving as a transition metal oxide film, and the Pt film 70 serving as an upper electrode are formed in this order on the second interlayer insulating film 65 and the W plug 66. In this case, the thicknesses of the Pt films 67, 70 are, for example, between 50 nm and 100 nm inclusive. In addition, as described above, the thickness of the Ni film 68 is between 5 nm to 20 nm inclusive and the thickness of the NiOx film 69 is between 5 nm and 65 nm inclusive.

Thereafter, an antireflection film (unillustrated) made of TiN is formed on the Pt film 70 with the thickness of, for example, 50 nm. Note that, this antireflection film is formed in order to prevent light reflection in the next photolithography process. Therefore, the antireflection film may be formed if needed, and is not a must in the present embodiment.

Thereafter, a resist film (unillustrated) having a predetermined shape is formed on the Pt film 70 (on the antireflection film). By using the resultant resist film as a mask, the Pt film 70, the NiOx film 69, the Ni film 68, and the Pt film 67 are etched. As a result, as depicted in FIG. 10F, formed is the resistance change element 71 having the structure in which the lower electrode 67a made of Pt, the transition metal film 68a made of Ni, the transition metal oxide film 69a made of NiOx, and the upper electrode 70a made of Pt are laminated.

Figure 10G:
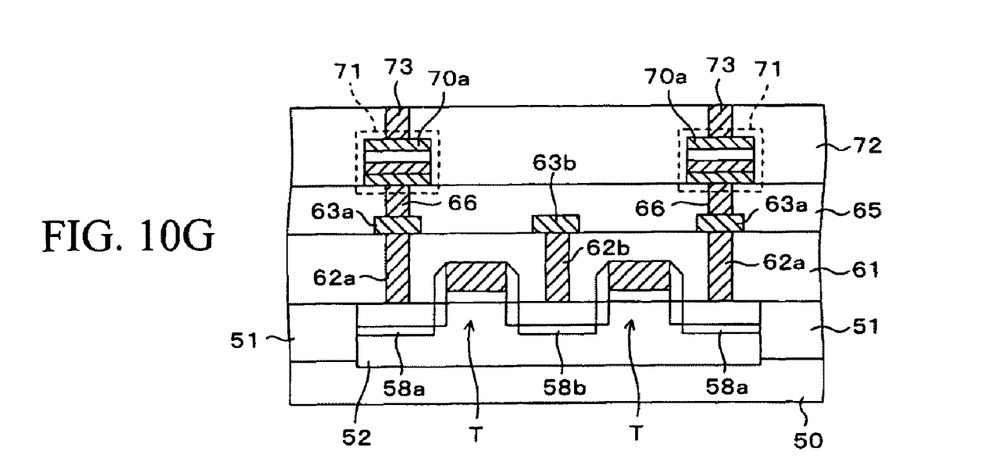
Figure 10H:
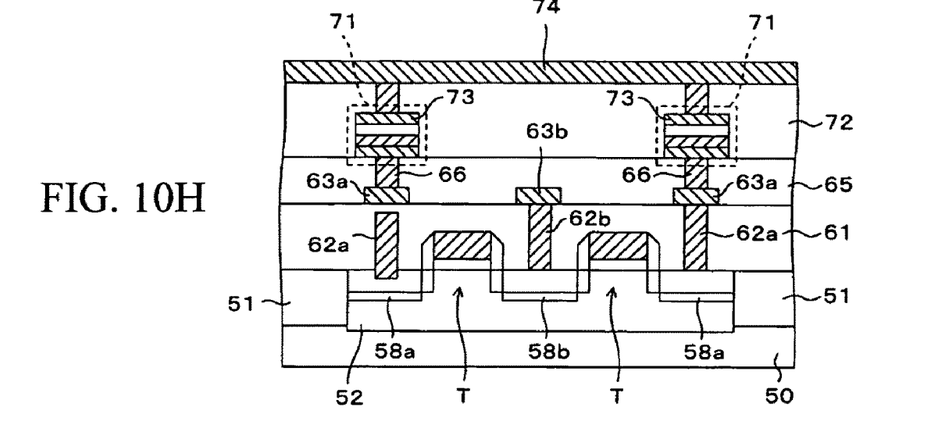

Next, the process to form the structure depicted in FIGS. 10G and 10H will be described. After the resistance change element 71 is formed by the process described above, as depicted in FIG. 10G, the third interlayer insulating film 72 made of $SiO_2$ is formed on the entire upper surface of the semiconductor substrate 50 by the CVD method. Subsequently, by using the photolithography method and the etching method, contact holes, each reaching the upper electrode 70a of the resistance change element 71 from the upper surface of the third interlayer insulating film 72, are formed. Thereafter, a TiN film (unillustrated) serving as a barrier metal is formed on the entire upper surface of the semiconductor substrate 50. After that, a W film is formed on the barrier metal by the sputtering method or the CVD method, while W is filled in the contact holes. Then, the W film and the TiN film are polished by the CMP method until the third interlayer insulating film 72 is exposed. In this manner, the W plug 73 electrically connected to the upper electrode 70a of the resistance change element 71 is formed.

Thereafter, a conducting film (unillustrated) having a laminated structure of TiN/Al/TiN/Ti, for example, is formed on the third interlayer insulating film 72 and the W plug 73 by the sputtering method. After that, the conducting film is patterned by the photolithography method and the etching method to form, as depicted in FIG. 10H, the wiring (bit line) 74. In this manner, the ReRAM according to the present embodiment is completed.

Note that, the present embodiment has been described by using the example in which the present embodiment is applied to a stack-type ReRAM. However, the present embodiment is also applicable to a planer-type ReRAM.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A resistance change element storing data by utilizing change in a resistance value, comprising:
    a ground-side electrode and a positive polarity-side electrode each being made of any one of a noble metal and a noble metal oxide;
    a transition metal film formed in contact with the ground-side electrode; and
    a transition metal oxide film formed between the transition metal film and the positive polarity-side electrode,
    wherein a thickness of the transition metal film is between 5 nm and 20 nm inclusive while a thickness of the transition metal oxide film is between 5 nm and 65 nm inclusive, and
    the transition metal film is made of Ni and the transition metal oxide film is made of NiOx (where x is any positive number).

2. A method of manufacturing a resistance change element, comprising:
    forming a first noble metal film made of any one of a noble metal and a noble metal oxide above a semiconductor substrate;
    forming a transition metal film on the first noble metal film;
    forming a transition metal oxide film on the transition metal film by a sputtering method; and
    forming a second noble metal film made of any one of a noble metal and a noble metal oxide on the transition metal oxide film,
    wherein the transition metal film is made of Ni while the transition metal oxide film is made of NiOx (where x is any positive number).

3. The method of manufacturing a resistance change element according to claim 2, wherein a thickness of the transition metal film is between 5 nm and 20 nm inclusive while a thickness of the transition metal oxide film is between 5 nm and 65 nm inclusive.

* * * * *